United States Patent [19]

Van Bokestal et al.

[11] 4,104,509

[45] Aug. 1, 1978

[54] SELF-REGULATING HEATING ELEMENT

[75] Inventors: André Marcel Alfred Van Bokestal; Charles Joseph Ghislain Belhomme, both of Brussels, Belgium

[73] Assignee: U.S. Philips Corporation, New York, N.Y.

[21] Appl. No.: 725,170

[22] Filed: Sep. 21, 1976

[30] Foreign Application Priority Data

Sep. 23, 1975 [NL] Netherlands ........................ 7511173

[51] Int. Cl.[2] ............................................... H05K 5/06

[52] U.S. Cl. ............................... 219/544; 174/52 PE; 338/22 R; 338/295; 338/256; 338/23; 219/544; 219/552

[58] Field of Search ............... 219/353, 385, 386, 441, 219/528, 541, 544, 552, 553; 338/22 R, 225 D, 23, 25, 256, 275; 174/52 PE, 110 S; 264/272

[56] References Cited

U.S. PATENT DOCUMENTS

| | | | |
|---|---|---|---|
| 3,081,374 | 3/1963 | Burch | 174/52 PE |
| 3,242,393 | 3/1966 | Pouli | 174/52 PE X |
| 3,251,015 | 5/1966 | Denham | 174/52 PE X |
| 3,390,226 | 6/1968 | Beyerlein | 174/52 PE |
| 3,444,399 | 5/1969 | Jones | 338/22 R X |
| 3,748,439 | 7/1973 | Ting et al. | 219/353 |
| 3,749,879 | 7/1973 | Armstrong | 219/441 X |
| 3,749,886 | 7/1973 | Michaelson | 219/528 |
| 3,778,685 | 12/1973 | Kennedy | 174/52 PE X |
| 3,824,328 | 7/1974 | Ting et al. | 174/52 PE |
| 3,858,144 | 12/1974 | Bedard et al. | 338/22 R |
| 3,995,141 | 11/1976 | Vieau et al. | 219/386 |
| 4,000,362 | 12/1976 | Kawaguchi et al. | 174/110 S X |
| 4,001,655 | 1/1977 | Voyles | 174/52 PE X |

*Primary Examiner*—Arthur T. Grimley
*Assistant Examiner*—Mark Paschall
*Attorney, Agent, or Firm*—Frank R. Trifari; Norman N. Spain

[57] ABSTRACT

Self-regulating heating element comprising one or more PTC resistors enveloped by a synthetic-material/filler mixture which has a good heat conductivity such as an $MgO-SiO_2$-silicon rubber mixture.

8 Claims, 1 Drawing Figure

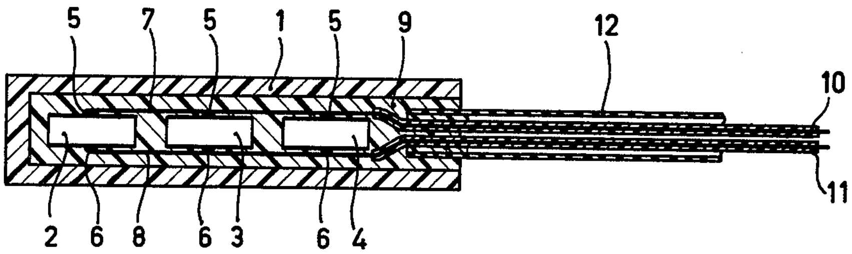
5
7
5
1
5
9
12
10
11
2
6
8
6
3
6
4

SELF-REGULATING HEATING ELEMENT

The invention relates to a self-regulating heating element which comprises at least a resistor body provided with current conductors and consisting of a material having a positive temperature coefficient of the electrical resistance, which is enclosed in a casing and at all sides surrounded by a heat conducting, electrically insulating compound. The invention also relates to a method for producing such a self-regulating heating element. Hereinafter the said resistor body will also be called PTC resistor.

Such resistor usually consist of sintered barium titanate which has been doped with rare earth, antimony, niobium or other elements or mixtures thereof with strontium titanate and/or lead titanate. The heat conductivity of such a material is relatively low and consequently also the heat dissipation in air. When loaded, the PTC resistor attains in these circumstances at a relatively low power consumption the temperature at which the resistance increases quickly (Curie point). A relatively small additional increase in temperature then results in a relatively large increase in the resistance. This sets a limit to the power which can be consumed and which can be dissipated in the form of heat.

It is inter alia an object of the invention to improve the heat dissipation in a heating element having one or more PTC resistors as heat source. Then also the maximum consumable power will be increased because, with an improved heat dissipation, the PTC resistors will reach the Curie point only at a larger power output. A heating element with good heat dissipation is, for example, known from British patent specification No. 1,306,907. In this known heating element the PTC resistor is enclosed in a casing and the space in the casing which is not occupied by the PTC resistor is filled with an electrically insulating liquid.

Although the liquids used in this construction generally do not conduct the heat particularly well a heat dissipation is obtained which is deemed sufficient owing to the convection currents in the liquid.

However, in practice a heating element filled with a liquid has some drawbacks. The casing must be, and must remain, absolutely liquid-tight even when the liquid tries to expand when it is heated during use of the element. This particularly involves problems of a constructional nature when the current conductors are connected through in the casing. Furthermore, it must be prevented as much as possible that improper usage might cause leaks resulting in the release of a hot liquid.

It is an object of the invention to provide a self-regulating heating element with one or more PTC resistors which satisfies the requirements described hereinbefore and for which the said drawbacks are avoided as much as possible.

According to the invention this requirement is satisfied by a self-regulating heating element which is characterized in that the heat-conducting, electrically insulating compound and the casing consist of a mixture which comprises a vulcanized synthetic resin material which is able to withstand the highest operating temperature, an electrically insulating, heat-conducting metal compound and a filler material.

As filler material the mixture preferably contains finely dispersed silicon dioxide and/or ground quartz up to a maximum of 50% by weight.

It has been found, that when the invented construction is used the difference in temperature between the PTC resistor and the outside of the casing is relatively small during operation and may amount to less than 25° at a sufficient electrical insulation. This, for example, enables the use of PTC resistors having a lower Curie point, while the temperature variations at the outside of the casing are small. The latter result achieved is even more so if, according to a preferred embodiment of the invention, the casing is in the form of a cylinder. It appears that it is not necessary, but of course possible to fabricate the PTC resistors also with a cylindrical shape.

In practice a vulcanized silicon rubber appeared to be particularly suitable as the synthetic material. In general this synthetic material may be used for a longer period of time at temperatures of approximately 200° C and higher which is amply sufficient for the current usage of the heating element. It appears to promote a temperature distribution which is as uniform as possible over the outside of the casing and a smallest possible temperature difference between the PTC resistor and the outside of the casing when the quantity of the heat-conducting metal compound and filler material in the potting compound and the casing is chosen as high as possibly allowed in view of the processing circumstances and the mechanical properties after vulcanization of the synthetic material, the compound and the casing. The heat conducting metal compound may, for example, consist of aluminum oxide, magnesium oxide, boron nitride, zirconium silicate or mixtures of such materials. However, the use of magnesium oxide, especially in combination with the use of a vulcanized silicon rubber and finely dispersed silicon oxide is preferred because magnesium oxide is cheap and easy to process and has good electrically insulating and heat-conducting properties. A suitable compound as material for the casing comprises 60 – 75% by weight of MgO, 12.5 – 50% by weight of finely dispersed $SiO_2$ and 12.5 – 20% by weight of silicon rubber.

A suitable potting compound consists of 15 to 42.5% by weight of silicon rubber, 7.5 to 70% by weight of MgO, and 15 to 50% by weight of finely dispersed $SiO_2$. The quantities of MgO and filler material to be used depend on the desired temperature of the outer wall of the casing when a specific PTC resistor is used. In a given case with a PTC resistor, which in use reached a temperature of 190° C, when using a potting compound which contained 65% by weight of MgO, 17.5% by weight of finely dispersed $SiO_2$ and 17.5% by weight of silicon rubber, the temperature of the outer wall of the casing appeared to be approximately 170° C, and when 15% by weight of MgO, 42.5% by weight of finely dispersed $SiO_2$ and 42.5% by weight of silicon rubber were used in the potting compound it appeared to be approximately 150° C. A suitable magnesium oxide comprises at least 80% by weight of particles with a diameter of between 100 and 400 micrometer. A suitable silicon dioxide comprises at least 80% by weight of particles with a diameter smaller than 50 micrometer.

According to another feature of the invention the self-regulating heating element may be produced by means of a method which is characterized in that a casing is formed in a first step from a synthetic material/filler mixture and the synthetic material is vulcanized, whereafter in a next step the casing is filled with the electrically insulating compound consisting of a synthetic material/filler mixture, the resistor body (ies)

are placed into the casing and the synthetic material is vulcanized. Normal commercially available products can be used as synthetic material, such as cold or heat-vulcanizable silicon rubbers which may or may not comprise a reinforcing filler material such as finely dispersed $SiO_2$. They are mixed in the usual manner with the heat conducting metal compound and, optionally, with an additional amount of extending filler material.

The invention will now be further explained with reference to the accompanying drawing, the only FIGURE of which shows, partly in cross-section an embodiment of a self-regulating element.

A casing 1 consisting of a synthetic material filler mixture comprises three PTC resistors 2, 3 and 4, which are interconnected in parallel via the current conductors 7 and 8. By means of solder 5 and 6 the current conductors 7 and 8 are connected to the electrodes (not shown) arranged on both sides of the PTC resistors 2, 3 and 4. The PTC resistors are embedded in a compound 9 which also consists of a mixture of synthetic material, heat conducting metal compound and filler material. From the place where this is possible the current conductors 7 and 8 are provided with an insulating layer 10 and 11. The current conductors 7 and 8, which are provided with an insulating layer 10 and 11 are, on leaving the casing 1, kept together over a given distance by means of the insulating sleeve 12, which partly extends to within the casing 1. The embodiment of a self-regulating resistor element shown in the FIGURE may, for example, be produced in the following manner.

The casing 1 is produced by injecting under pressure a paste consisting of 15% by weight of heat vulcanizable silicon rubber, 15% by weight of finely dispersed $SiO_2$ and 70% by weight of magnesium oxide powder into a suitable mould by means of an injection moulding press and by vulcanizing it thereafter under pressure and at an elevated temperature (160° C) for 15 seconds. Thereafter a suitable quantity of a compound 9 is introduced into the casing 1 by means of a metering apparatus which compound also consists of 15% by weight of heat vulcanizable silicon rubber, 15% by weight of finely dispersed $SiO_2$ and 70% by weight of magnesium oxide powder. The quantity of the compound 9 is preferably calculated such that when the PTC resistors 2, 3 and 4 are applied no compound 9 is forced from the casing 1 and the PTC resistors 2, 3 and 4 are fully enveloped. The PTC resistors 2, 3 and 4 are provided with the leads 7 and 8 and insulating sleeve 12 is pushed into the casing 1. Thereafter the compound 9 is vulcanized in air at 180° C for 5 minutes.

In a given construction the casing 1 was of a cylindrical shape and had a diameter of 15 mm and a length of 73 mm. The insulating voltage was at least 7 kV. In operation the temperature at the outside of the casing was approximately 200° C ± 5° C. The temperature difference between the PTC resistors and the outside of the casing 1 was approximately 20° C. The same results were obtained with a heating element of exactly the same construction, however provided with two PTC resistors and, on connection therewith a length of the casing of 50 mm.

Heating elements according to the invention may, for example, be used in hair curlers, immersion heaters for heating liquids, electric flat irons, coffee makers, hot plates (dish warmers) etc. The heating element according to the invention combines a great reliability with a relatively simple construction.

What is claimed is:

1. In a self-regulating heating device containing at least one resistor body provided with current conductors and consisting of a ceramic body having a positive temperature coefficient electrical resistance, a casing enclosing said resistor body and spaced from said resistor body by heat conducting electrically insulating material surrounding said resistor body and located between said resistor body and said casing, the improvement wherein both the casing and the material located between the casing and the resistor body consist essentially of a vulcanized synthetic resin material capable of resisting the highest operating temperature of said device, an electrically insulating, heat conducting metal compound and a finely divided reinforcing filler material.

2. A self-regulating heating element as claimed in claim 1, characterized in that the synthetic resin material consists of a vulcanized silicon rubber.

3. A self-regulating heating element as claimed in claim 1, characterized in that the heat-conducting metal compound consists of magnesium oxide.

4. A self-regulating heating element as claimed in claim 1, characterized in that the reinforcing filler material consists of finely dispersed $SiO_2$.

5. A self-regulating heating element as claimed in claim 1, characterized in that the casing has a cylindrical shape.

6. A self-regulating heating element as claimed in claim 1, characterized in that the casing consists essentially of 30 - 75% by weight of MgO, 12.5 - 50% by weight of finely dispersed $SiO_2$ and 12.5 - 20% by weight of silicon rubber.

7. A self-regulating heating element as claimed in claim 1, characterized in that the casing consists essentially of 70% by weight of MgO, 15% by weight of finely dispersed $SiO_2$ and 15% by weight of silicon rubber.

8. A self-regulating heating element as claimed in claim 1, characterized in that the material surrounding said resistor body consists of 7.5 to 70% by weight of MgO, 15 to 50% by weight of finely dispersed $SiO_2$ and 15 to 42.5% be weight of silicon rubber.

* * * * *